(12) United States Patent
Matsuoka et al.

(10) Patent No.: US 8,437,584 B2
(45) Date of Patent: May 7, 2013

(54) OPTICAL I/O ARRAY MODULE AND ITS FABRICATION METHOD

(75) Inventors: Yasunobu Matsuoka, Hachioji (JP); Toshiki Sugawara, Kokubunji (JP); Koichiro Adachi, Musashino (JP); Naoki Matsushima, Chiba (JP); Saori Hamamura, Fujisawa (JP); Madoka Minagawa, Yokohama (JP); Norio Chujo, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 336 days.

(21) Appl. No.: 12/844,452

(22) Filed: Jul. 27, 2010

(65) Prior Publication Data

US 2011/0026878 A1 Feb. 3, 2011

(30) Foreign Application Priority Data

Jul. 28, 2009 (JP) .................................. 2009-175635

(51) Int. Cl.
*G02B 6/26* (2006.01)
*G02B 6/42* (2006.01)

(52) U.S. Cl.
USPC ................................................ 385/14; 385/18

(58) Field of Classification Search .................. None
See application file for complete search history.

(56) References Cited

U.S. PATENT DOCUMENTS

| | | | | |
|---|---|---|---|---|
| 6,804,423 | B2 * | 10/2004 | Tsukamoto et al. | 385/14 |
| 6,829,398 | B2 * | 12/2004 | Ouchi | 385/14 |
| 7,310,457 | B2 * | 12/2007 | Kotake | 385/14 |
| 7,315,669 | B2 * | 1/2008 | Ohtorii | 385/14 |
| 7,366,375 | B2 * | 4/2008 | Ohtorii | 385/33 |
| 7,526,153 | B2 * | 4/2009 | Uchida | 385/18 |
| 7,724,989 | B2 * | 5/2010 | Kodama et al. | 385/14 |
| 8,165,429 | B2 * | 4/2012 | Lee et al. | 385/14 |
| 2006/0078248 | A1 | 4/2006 | Sasaki et al. | |
| 2007/0183720 | A1* | 8/2007 | Ide et al. | 385/47 |
| 2008/0308311 | A1* | 12/2008 | Kodama et al. | 174/260 |

FOREIGN PATENT DOCUMENTS

JP  2006-133763 A  5/2006

* cited by examiner

*Primary Examiner* — Tina Wong
(74) *Attorney, Agent, or Firm* — Crowell & Moring LLP

(57) ABSTRACT

In fabricating an optical I/O array module, an optical waveguide provided with mirror parts, each having a tapered face, is formed on a substrate, a convex shaped member or a concave shaped member is placed at spots above the respective mirror parts of the optical waveguide, and laser diode arrays and photo diode arrays, provided with either a concave shape, or a convex shape, are mated with, or into the convex shaped member or the concave shaped member before being mounted. Further, there are formed multiple filmy layers, on which an LSI where a driver IC LSI of optical elements, and an amplifier LSI of the optical elements are integrated.

10 Claims, 12 Drawing Sheets

OPTICAL I/O ARRAY MODULE AND ITS FABRICATION METHOD

CLAIM OF PRIORITY

The present application claims priority from Japanese patent application JP 2009-175635 filed on Jul. 28, 2009, the content of which is hereby incorporated by reference into this application.

FIELD OF THE INVENTION

The present invention relates to an optical I/O array module for batch processing massive amounts of optical signals that are transmitted and received in an intra-rack, the transmission equipment using the same, and a method for fabricating the same.

BACKGROUND OF THE INVENTION

Recent years have seen rapid advances in servicing of communication traffic by optical signals in the field of information and telecommunications, and there has so far been developed a fiber-optic network, such as the backbone, metropolitan, and access systems, over a relatively long distance at least several km. In order to process massive amounts of data travelling over a shorter distance such as rack-to-rack (in a range of several to several hundreds of m), or a distance (in a range of several to several tens of cm) in a transmission device without delay in the future, use of a light signal is considered effective, and a progress is being made in utilization of optical communication techniques for transmission between LSIs, or between an LSI and a backplane, within an information processing equipment such as a router, server, and so forth.

As for adoption of optical interconnection between information devices/within an information device, with a transmission device such as, for example, a router/a switch, a high-frequency signal transmitted from outside such as Ethernet using an optical fiber is inputted to a line card. Further, one sheet of backplane is made up of several sheets of the line cards, and input signals to the line cards are further collected by a switch card through the backplane to be processed by LSIs inside the switch card before being outputted to the line cards through the backplane again. With a transmission device as it is, signals of at least 300 Gbps from the respective line cards converge on the switch card through the backplane at present. For transmission of the signals via electrical interconnects as they are, the signals need be divided into portions, each on the order of 1 to 3 Gbps, so that at least 100 lengths of interconnects will be required in consideration of a propagation loss.

Further, such high-frequency paths need to have a pre-emphasis/equalizer, and countermeasures against reflection, or cross talk between interconnects. As further progress is made in larger capacity of a system from now on, the transmission device will come to process information in terms of at least Tbps, whereupon problems such as the number of lengths of interconnects, and countermeasures against cross talk, and so forth will be increasingly serious to the conventional electrical interconnects. In contrast, if an optical fiber is adopted for a signal transmission path between boards within the device that is, from the line card→ the backplane→ the switch card, and further, for a signal transmission path between chips within a board, this will enable a high-frequency signal of at least 10 Gbps to be propagated with a small loss, so that it is possible to make do with fewer lengths of interconnects, and the countermeasures described as above are no longer required for the high-frequency signal, which is therefore promising. In order to implement such a high-speed optical interconnection circuit, and to apply the same between the devices/within the device, there will be the need for an optical module circuit excellent in respect of performance, miniaturization, integration, and component-mountable property, that can be manufactured by an inexpensive manufacturing means.

What are considered important upon construction of a light signal transmission structure include a coupling part between a photonic device (an optical element) and an optical signal transmission line such as an optical waveguide, an optical fiber, and so forth. When light from a laser diode is caused to propagate to an optical interconnect, or light propagated from an optical signal transmission line is caused to fall on a photo diode, positioning of the optical element and the optical signal transmission line need be implemented with high precision in order to effect sufficiently efficient optical coupling. Meanwhile, in consideration of mass-productivity and practicality, LSIs for use in an optical coupler, and the information device are preferably removable•replaceable with ease For example, in JP-A-2006-133763, for coupling between the optical element and the optical signal transmission line, a structure is adopted, whereby positioning of the optical element and the optical signal transmission line can be implemented by use of guide pins, thereby effecting mounting of the optical element, and LSIs with the use of socket pins. By so doing, it has become possible to implement the positioning of the optical element and the optical signal transmission line with relative ease, and LSIs are removable with ease as mounting thereof is carried pout with the use of the socket pins.

SUMMARY OF THE INVENTION

With the structure described as above, however, the coupling of the optical element with the optical signal transmission line is implemented through the positioning thereof with the use of the guide pins, so that positioning accuracy is dependent on accuracy in fabrication•mounting of the guide pins. In general, optical input/output (I/O) parts of an optical element, an optical interconnect, and so forth, for use in high-speed signal transmission, are of a size in a range of on the order of several to dozens of μm, and there is the need for optical linkage between an input/output face of the optical element, and an input/output face of the optical waveguide, in a micro-region of the size described as above. For this reason, mounting tolerance in concurrently meeting positioning accuracy of each optical component is small, so that there are limitations to capability of ensuring excellent optical performance simply by depending on accuracy in fabrication•mounting of members made up of separate components such as pins, sockets, and so forth, and there will result an increase in the number of components, and a rise in the fabrication cost of a member for obtaining high accuracy.

Further, in the case where the optical element and the optical waveguide each are rendered to serve as a multi-channel, it will be increasingly difficult to secure a production yield for enabling stable optical linkage to be obtained. Still further, it is to be pointed out that a distance between the optical element, and an LSI cannot be shortened. With present structure, the optical element is disposed on the outer side of the LSI instead of directly underneath thereof. Accordingly, in order to cause a signal to be propagated to the optical element, connection in an interval between the optical element and the LSI must be made with the use of an electrical interconnect. Even if a transmission speed of a signal from the LSI is increased, the interval acts as a rate-controlling factor, thereby preventing a satisfactory transmission speed from being obtained. Further, a loss will increase to the extent of an increase in length of the electrical interconnect, thereby raising the risk of an increase in power consumption. Furthermore, it is not possible to increase packaging density to a sufficiently high level either, thereby inviting an increase in the size of a board. As to positioning accuracy of the optical element as well as the optical signal transmission line, if an attempt is made for efficient positioning of all channels, this will cause bonding parts to be subjected to a large stress when positional tolerance of respective guide pins as well as respective socket pins are taken into consideration, so that significant deterioration in reliability is anticipated.

It is therefore an object of the invention to provide an optical I/O array module capable of attaining highly accurate and stable optical linkage between an optical element, and an optical waveguide in a transmission device for batch processing massive amounts of light signals while being easily manufactured with fewer components, increasing a transmission speed per a channel by shortening a distance between the optical element, and an LSI as much as possible, adopting a structure for reducing power consumption, and easily removing an LSI, and a component from the viewpoint of practicality, and a transmission device using the optical I/O array module, and a method for fabricating the same.

To that end, in accordance with one aspect of the invention, there are provided an optical I/O array module wherein an optical waveguide formed on a substrate, for propagating a light signal, and mirror parts, each having a tapered face at both ends of the optical waveguide are provided, a convex shaped member or a concave shaped member is placed at spots above the respective mirror parts, laser diode arrays and photo diode arrays, provided with either a concave shape, or a convex shape, to be mated with the convex shaped member, or into the concave shaped member, are mounted, multiple filmy layers having visible transparency, provided with electric vias, are formed over the laser diode arrays and the photo diode arrays, respectively, at least one LSI of LSIs provided above the filmy layer, the LSIs integrating at least either a driver IC LSI of respective optical elements, or an amplifier LSI of the respective optical elements, or at least one LSI of the driver IC LSI and the amplifier LSI, the laser diode array and the photo diode array, provided with a convex shape, respectively, is mated into the concave shaped member, while the laser diode array, and the photo diode array, provided with a concave shape, respectively, are mated with the convex shaped member to effect positioning, thereby causing the laser diode array, and the photo diode array to be optically linked with the optical waveguide, and an electrode pad in the optical element is electrically connected with interconnects of the filmy layer, subsequently mounting the LSIs on the filmy layer for electrical connection, and a method for fabricating the optical I/O array module.

According to an aspect of the present invention, the convex shaped member or the concave shaped member is placed at the spots above the respective mirror parts, and the laser diode array, and the photo diode array, provided with the concave shape, or the convex shape, respectively, are placed on the top of the convex shaped member or the concave shaped member, respectively, thereby causing fitting with each other, so that it is possible to implement highly accurate mounting of the optical elements, using fewer components, with ease. Furthermore, since the optical elements can be mounted with high precision, bonding between the optical elements, and the optical waveguide can be effected at a low loss, so that it is possible to realize efficient and high-quality optical transmission at low power consumption.

Further, as electrical connection between the optical element, and the driver IC, the amplifier IC, or an LSI incorporating those circuit ICs can be effected by thin-film interconnects covering a short distance, it is possible to increase a transmission speed per channel while preventing an increase in power consumption. Furthermore, LSIs can be mounted by use of the conventional and simple techniques such as solder-bonding or the like, and assembling can be executed with ease while no special technique is required for removal of the LSIs.

Thus, the present invention can provide an optical I/O array module large in transmission capacity, operable at low power consumption, and capable of reduction in the number of components, and the number of fabricating process steps to thereby attain reduction in cost.

DETAILED DESCRIPTION OF THE PREFERRED EMBODIMENTS

Embodiments of the invention are described hereinafter with reference to the accompanying drawings.

First Embodiment

Figure 1:
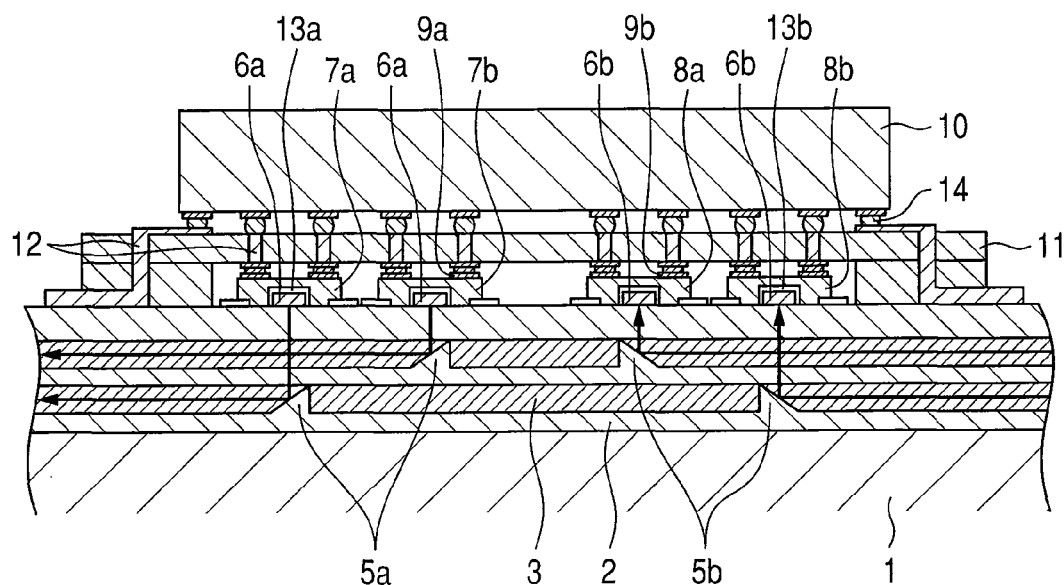
FIG. 1 is a sectional view showing an optical I/O array module according to a first embodiment of the present invention.

First, in FIG. 1, there is shown a first embodiment of the present invention. FIG. 1 is a sectional view showing an optical I/O array module according to the present invention. An optical waveguide (core) 3 for use in propagation of a optical signal is provided in such a way as to be covered by a clad 2 on a substrate 1 made up of FR-4, and so forth, and mirror parts 5a, 5b, each having a face tapered at an angle of 45°, are formed at optional spots of the optical waveguide 3, respectively. With the present embodiment, the optical waveguide 3 is formed in two layers in order to enhance packaging density, but it may be formed in a single layer, or three or more layers instead. Further, convex shaped members 6a, 6b are provided on the top surface of the substrate 1, and directly above the mirror parts 5a, 5b, respectively In this connection, there is no limitation to the convex members 6a, 6b as long as the convex members 6a, 6b each have transparency against the wavelength of signal light in use, however, if use is made of a material belonging to the same material group (for example, a group of materials having the same property in respect of optical property, and workability) as a material group which a constituent material of the optical waveguide 3 belongs to, this will render both a fabricating method and facilities simpler, and more effective. Laser diode arrays 7a, 7b, and photo diode arrays 8a, 8b, provided with concave shaped grooves 13a, 13b, formed on the top of the convex members 6a, 6b, respectively, are mated with the convex shaped members 6a, 6b, respectively, to be thereby mounted such that positioning is effected at desired spots, respectively. The convex shaped members 6a, 6b, and the concave shaped grooves 13a, 13b are of a concentric circle, square, or polygon, and so forth in planar shape, and there is no particular limitation thereto, however, if the convex shaped members 6a, 6b, or the respective bottoms of the concave shaped grooves 13a, 13b are provided with a lens-like shape, the concentric circle is preferable from the viewpoint of easiness in fabricating.

Further, if a difference in width size between the convex shaped member 6a, or 6b and the concave shaped groove 13a, or 13b is kept to several μm, positioning accuracy upon fitting can be held to the order of several μm as well, so that it will be possible to obtain higher efficiency of optical coupling between the optical waveguide 3, and the laser diode arrays 7a, or 7b, and between the optical waveguide 3, and the photo diode arrays the 8a, or 8b. With present embodiment, the laser diode arrays 7a, 7b each are a surface-emitting semiconductor laser. The laser may be either a VCSEL (Vertical Cavity Surface Emitting Laser) including a laser resonator formed in the vertical direction, or a laser having a structure wherein a laser resonator is provided in the horizontal direction, and light is emitted in the vertical direction by a mirror. The photo diode arrays 8a, 8b each are a surface-incident photodiode.

Those optical elements are of an array type wherein multiple light-emitting Emission/optical-receiving faces are integrated from a point of view of packaging density. With the present embodiment, electrodes 9a, 9b, for causing current to flow to the optical elements, respectively, are provided on the distal side of the optical waveguide 3 (on an upper side thereof, in the figure). Those electrodes each are electrically connected with an electric via 12 provided in a filmy layer 11 formed in a layer above the laser diode arrays, and the photo diode arrays. For the filmy layer 11, use is made of a material having visible transparency in order to enable positioning to be executed while observing the electric vias 12 formed in the filmy layer 11, and the electrodes 9a, 9b, provided in the optical elements, respectively, at the time when the filmy layer 11 is formed on the top of the laser diode arrays, and the photo diode arrays.

Further, an LSI 10 is disposed above the filmy layer 11. The LSI 10 is provided with electrode pads, which are electrically connected with the electric vias 12 in the filmy layer 11, respectively, through the intermediary of a bump 14. The bump 14 may be any type of bump such as a solder ball, and an Au stud bump, or a plating bump, and so forth. With the present embodiment, a driver IC for a semiconductor laser, and an amplifier for a photodiode are integrated in the LSI 10. Needless to say, a structure may be adopted, wherein those driver ICs/amplifier ICs are provided independently from the LSI 10.

Further, as the electrodes 9a, 9b, in the optical elements, respectively, and the electrode pads of the LSI 10 are disposed at pitches identical to each other so as to be in a positional relationship identical to each other, it is possible to provide an interconnect extended straight ahead through the electric via 12 of the filmy layer 11, covering a minimum distance, which is advantageous in terms of high-frequency property. However, if the electrodes 9a, 9b, in the optical elements, respectively, differ in respect of the pitches, or the positional relationship from the electrode pads of the LSI 10, respectively, the filmy layer 11 may be converted into a multilayered one to enable re-interconnection, thereby adopting a structure wherein the pitches are converted within the filmy layer 11.

With the adoption of the structures described as above, there is provided an optical I/O array module of a structure wherein the laser diode arrays 7a, 7b, and the photo diode arrays 8a, 8b, provided with the concave grooves 13a, 13b, respectively, are mated with the convex members 6a, 6b, respectively, whereupon positioning is implemented to thereby effect optically linkage to the optical waveguide 3, while the electrodes 9a, 9b, provided in the optical elements, respectively, are electrically connected to the bumps 14 of the LSI 10 mounted on the filmy layer 11, respectively, through the intermediary of the electric via 12 in the filmy layer 11.

Figure 2:
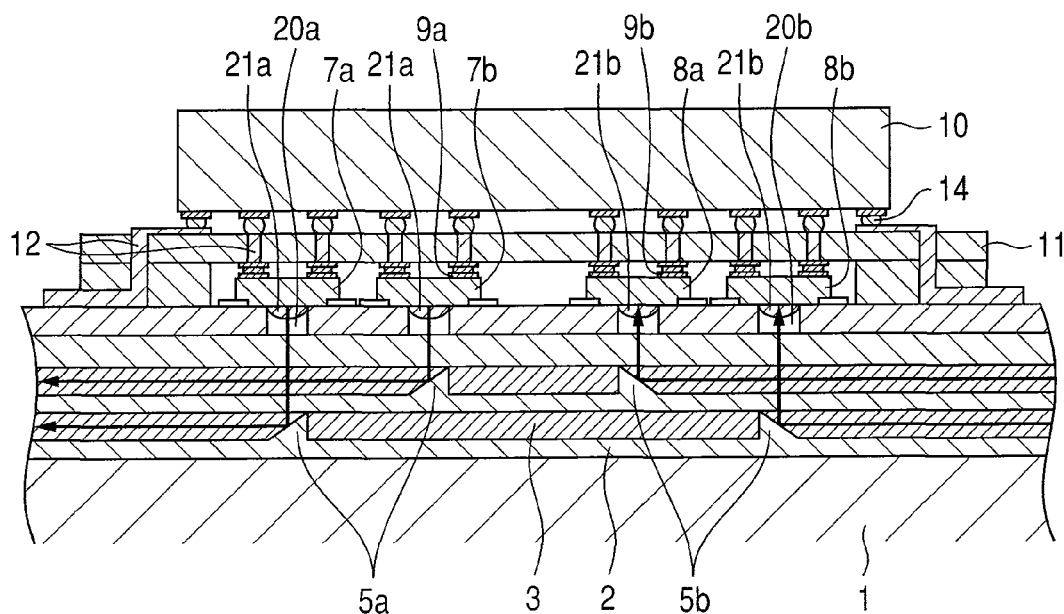
FIG. 2 is a sectional view showing the structure of another mode of the optical I/O array module according to the present invention, wherein concave groove members are provided directly above mirror parts, respectively, and the concave groove members are mated with laser diode arrays, and photo diode arrays, provided with convex members respectively.

With the example shown in FIG. 1, there is described the optical I/O array module of the structure wherein the laser diode arrays 7a, 7b, and the photo diode arrays 8a, 8b, provided with the concave grooves 13a, 13b, formed on the top of the convex members 6a, 6b, respectively, are mated with the convex members 6a, 6b, respectively. FIG. 2 is a sectional view showing another optical I/O array module that differs in structure from that shown in FIG. 1. With a structure shown in FIG. 2, concave groove members 20a, 20b are provided on the top surface of the substrate 1, and directly above mirror parts 5a, 5b, respectively. Laser diode arrays 7a, 7b, and photo diode arrays 8a, 8b, provided with convex members 21a, 21b, formed on the top of the concave groove members 20a, 20b, respectively, are mated into the concave groove members 20a, 20b, respectively, to be thereby mounted such that positioning is effected at desired spots, respectively. Thus, with the adoption of the structure shown in FIG. 2, as well, an optical I/O array module according to the invention can be completed.

Figure 3A:
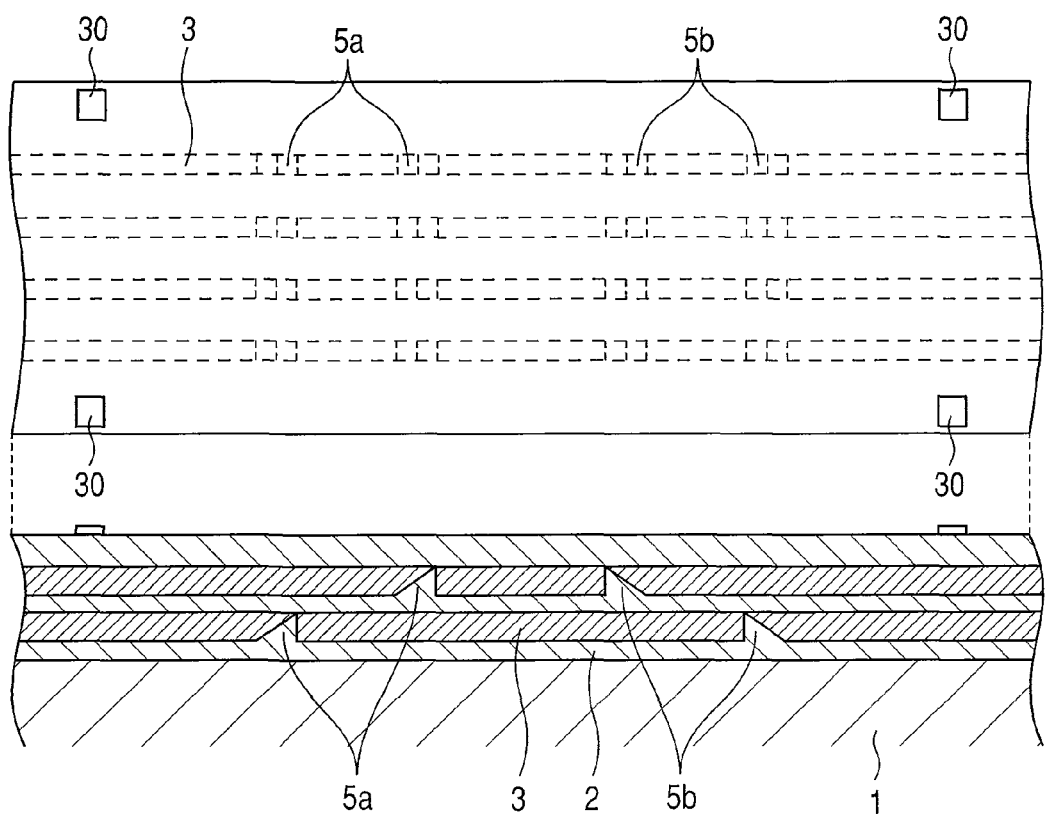
FIG. 3A is a view showing a state where an optical waveguide for use in propagation of a light signal is provided on a substrate.

Now, referring to FIGS. 3A to 3F, respectively, there is described a fabricating method of the optical I/O array module shown in FIG. 1 by way of example. First, FIG. 3A shows a state where the clad 2 is provided on the substrate 1, and the optical waveguide 3 for use in propagation of a light signal is provided on the top of the clad 2. For a constituent material of the substrate 1, use is made of glass epoxy, and so forth, for common use in a printed circuit board (PCB). For a constituent material of the optical waveguide 3, use is suitably made of a photosensitive polymer having an excellent affinity with a printed circuit board process as compared with quartz, capable of easily fabricating the optical waveguide 3 by use of the photolithography. Further, for a constituent material of the core for use in propagation of light inside the optical waveguide 3, use of the photosensitive polymer is advantageous since the core can be formed by the photolithography. The mirror parts 5a, 5b, tapered in sectional shape, are formed at the optional spots of the optical waveguide 3, respectively. Furthermore, for fabrication of the mirror parts 5a, 5b, use can be made of techniques such as dicing, physical processing by use of a laser, and so forth. According to a procedure described as above, an optical waveguide substrate is completed.

Figure 3B:
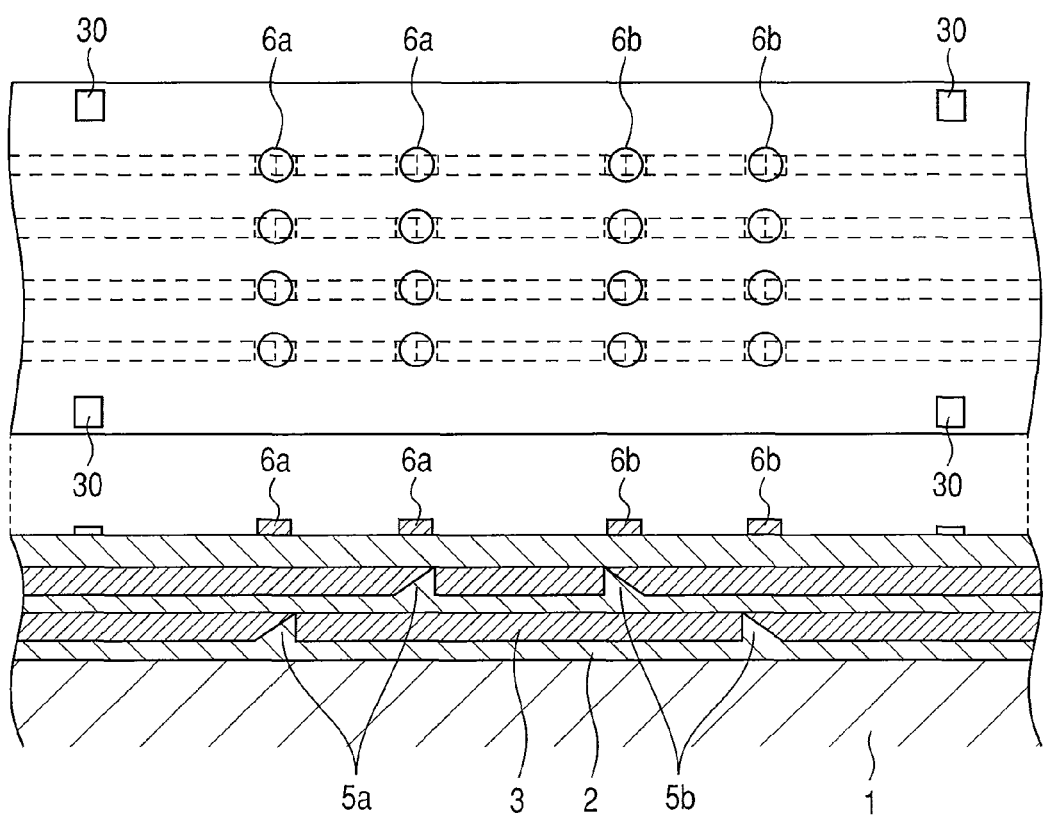
FIG. 3B is a view showing a state where the convex members are formed on the surface layer of the optical waveguide.

Now, when fabricating the optical waveguide 3, and the mirror parts 5a, 5b, positioning marks 30 are formed on the substrate, and by referring to the positioning marks 30, respectively, fabrication with high positioning accuracy can be implemented. Then, as shown in FIG. 3B, the convex members 6a, 6b are formed on the surface layer of the optical waveguide 3. At this point in time, the convex members 6a, 6b are formed by referring to the respective positioning marks 30 used when fabricating the optical waveguide 3, whereupon the convex members 6a, 6b as well as the mirror parts 5a, 5b of the optical waveguide 3 can be fabricated with high positioning accuracy.

Figure 3C:
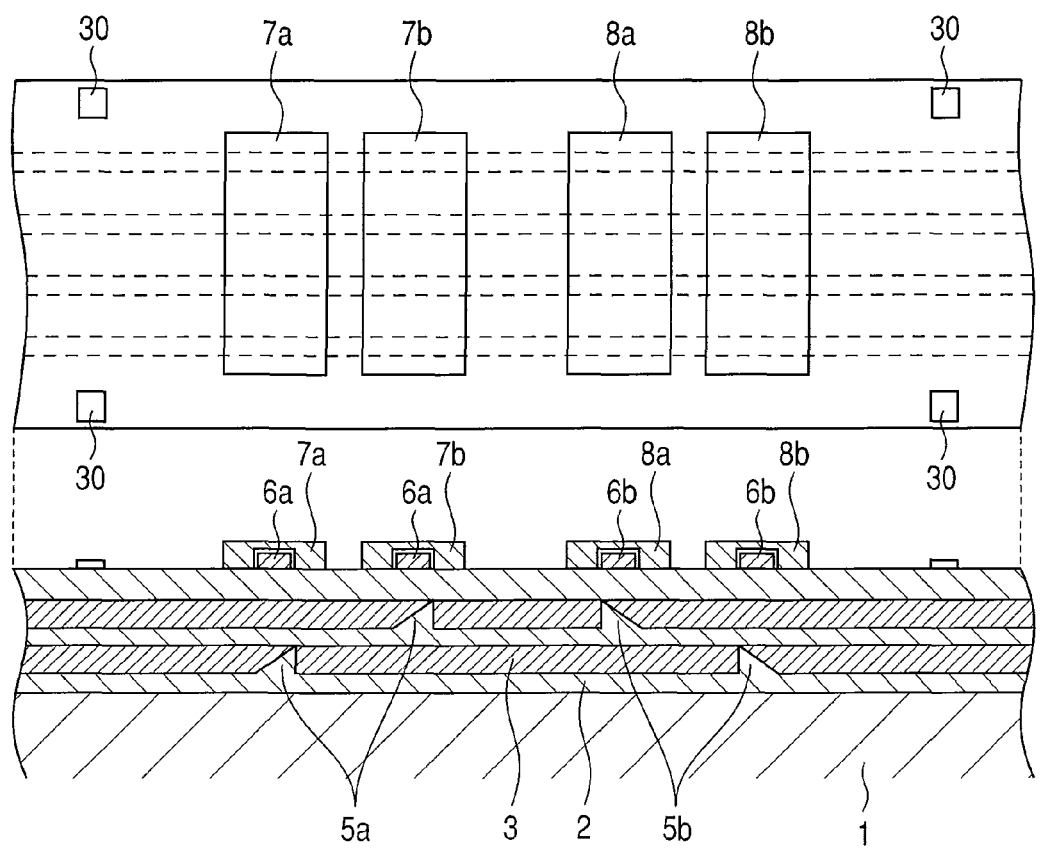
FIG. 3C is a view showing a state where the laser diode arrays, and the photo diode arrays, provided with the concave grooves, respectively, are mated with the convex members, respectively, to be thereby mounted at desired spots, respectively.

Subsequently, as shown in FIG. 3C, the laser diode arrays 7a, 7b, and the photo diode arrays 8a, 8b, provided with the concave grooves 13a, 13b formed on the top of the convex members 6a, 6b, respectively, are mated with the convex members 6a, 6b, respectively, to be thereby mounted at desired spots, respectively. As a means for securely holding the optical elements, use can be made of an adhesive or the like, having transparency against the wavelength of light in use, however, use may be made of a non-transparent adhesive instead. If metallization can be formed on a side of the optical elements, adjacent to the printed circuit board, use may be made of solder joint.

Figure 3D:
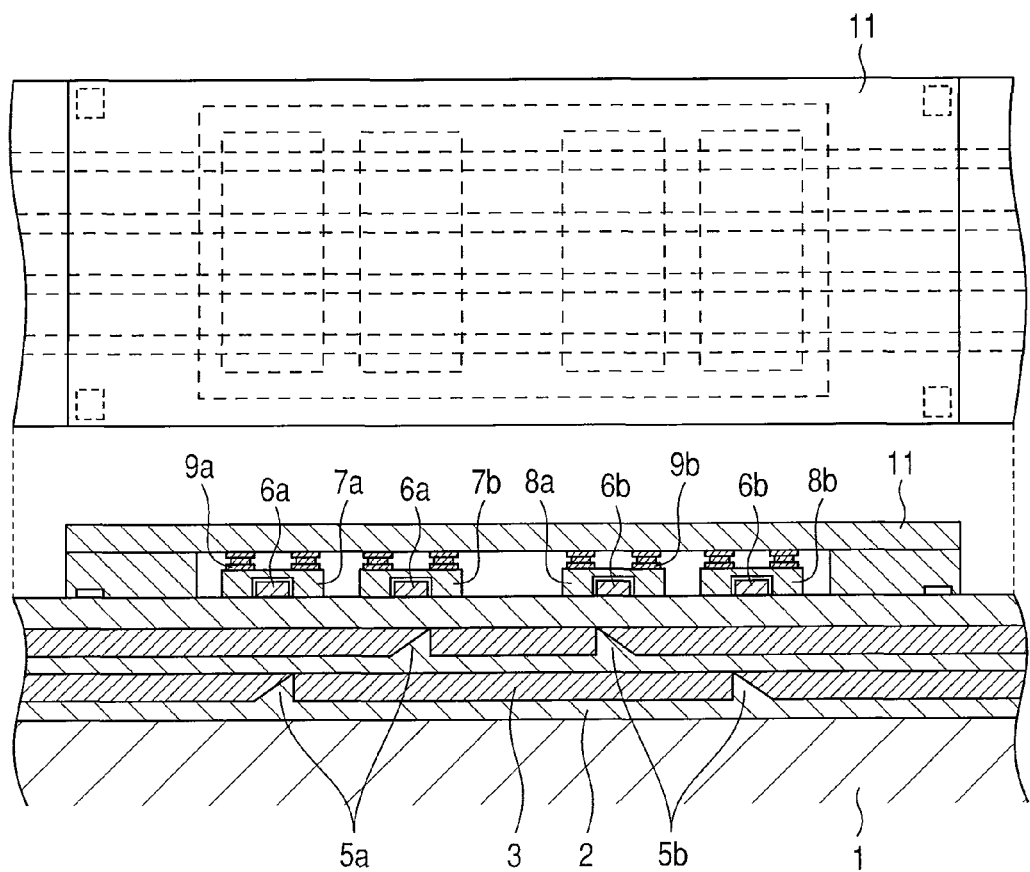
FIG. 3D is a view showing a state where a filmy layer is formed in a layer above the optical elements.

Further, as shown in FIG. 3D, the filmy layer 11 made of an insulating material is formed in a layer above the optical elements. First, a first layer of the filmy layer is formed in the peripheral part of the optical elements, and subsequently, a second layer of the filmy layer 11, having visible transparency, is formed by stacking.

Figure 3E:
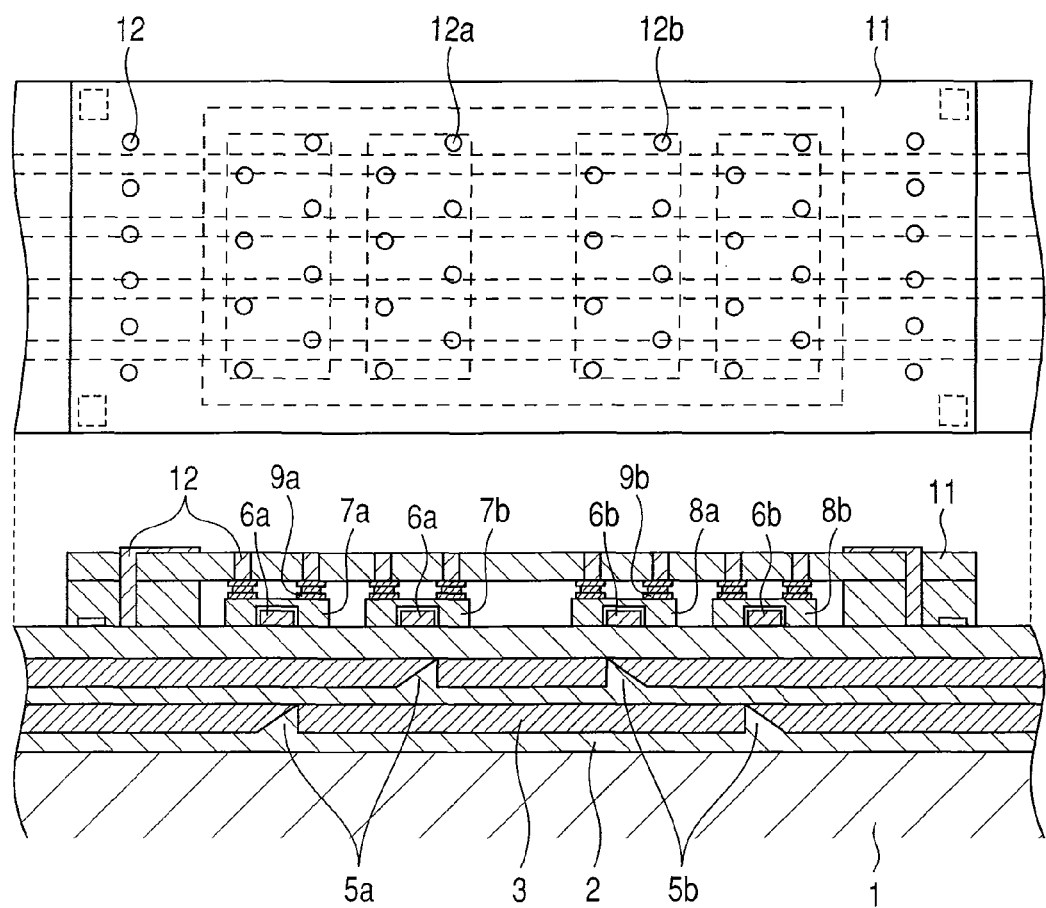
FIG. 3E is a view showing a state where through holes, each serving as a via, are formed in the filmy layer.
Figure 3F:
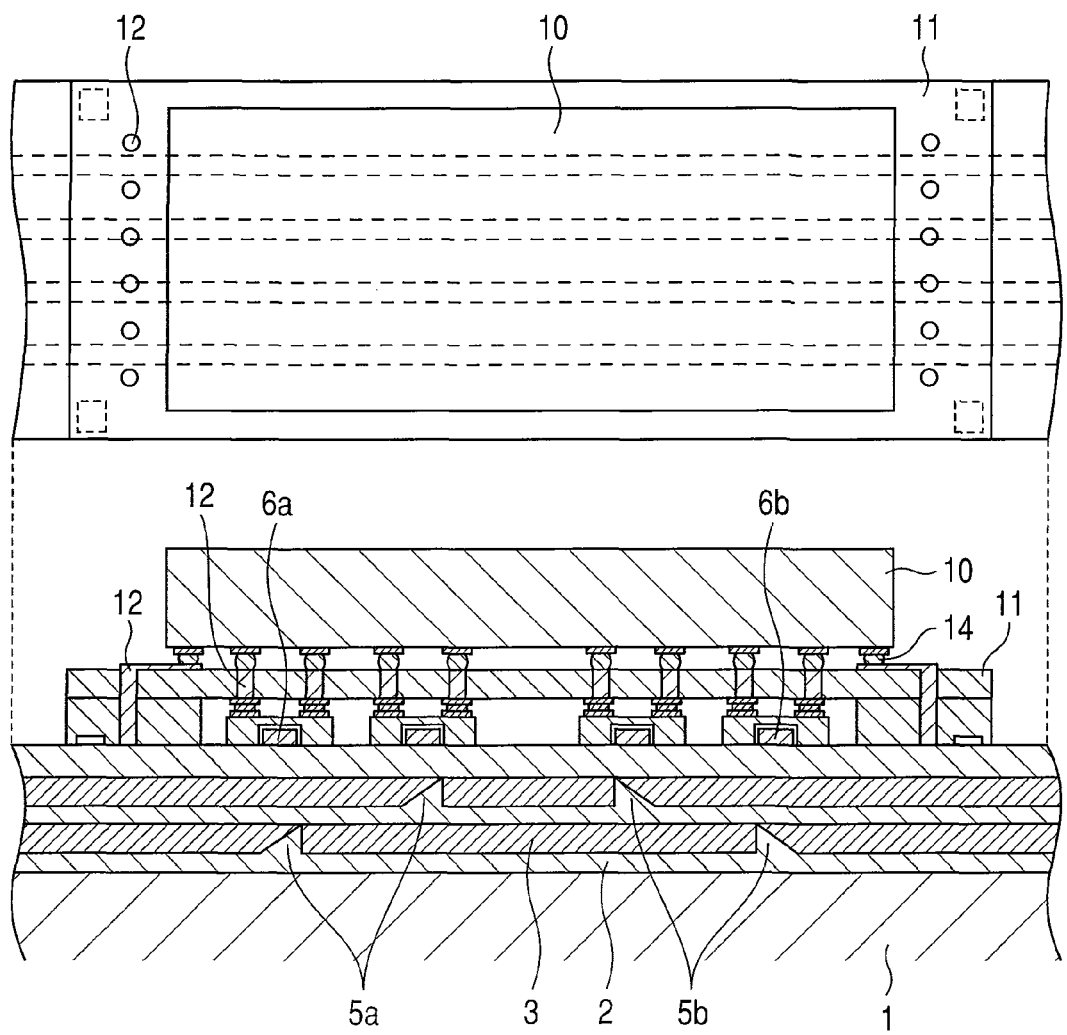
FIG. 3F is a view showing a state where an LSI is mounted on the top of the filmy layer, thereby completing an optical I/O array module.

Then, as shown in FIG. 3E, through holes, each serving as the via for electrical connection with the electrodes 9a, 9b of the optical elements, respectively, are formed in the filmy layer 11. As a method for forming the through holes, the filmy layer 11 having visible transparency, in a sheet form, is press-bonded, and use may be made of techniques such as dry etching, laser ablation, sandblasting, and so forth, by aiming at respective positions of the electrodes 9a, 9b of the optical elements, respectively, while making observation from above. Subsequently, there is formed the filmy layer 11, which serves as a thin-film interconnect layer. Electric coating or the like is adopted to fill the via up. Further, filmy layers may be laminated together to effect multiple-layer lamination by repeating the steps of processing shown in FIGS. 3D, 3E, respectively. Finally, as shown in FIG. 3F, the LSI 10 is mounted on the top of the filmy layer 11. The LSI 10 is a device in which the driver IC of the semiconductor laser, and the amplifier of the photodiode are integrated. For a bonding method, use is made of a bump using Sn-based solder, and bonding can be implemented by use of reflow bonding, and so forth after the LSI is mounted. Further, as for a bump-bonding method, use may be made of a method other than the above, such as an ultrasonic bonding method by use of, for example, an Au bump, a bonding method by use of an Au bump, and solder, a method for solder-bonding after formation of plated bumps, and so forth. The bonding method using the solder bump has an advantage in that if temperature is increased to solder's melting point, or higher, this will enable the LSI to be easily removed or replaced.

As means for further enhancing the mass-productivity of the optical I/O array module according to the invention, there is available a means for providing redundancy. More specifically, there is provided combination of an optical waveguide with optical elements more in numbers than optical elements that are put to actual use. In case that a defect occurs to a thin-film interconnect for connecting an optical element to an LSI, or a defect occurs to an optical element, and an optical waveguide, use is made of interconnect•optical element•optical waveguide, prepared in reserve, while if those constituents are formed without a defect, reserve circuits will be kept in as non-usable state in terms of circuitry and physically.

The optical I/O array module according to the invention, shown in FIG. 1, is completed by the fabricating method described in the foregoing by way example.

Second Embodiment

Now, a procedure of fabricating a laser diode array to be mounted in an optical I/O array module according to a second embodiment of the invention is described by way of example with reference to FIGS. 4A to 4D, respectively.

Figure 4A:
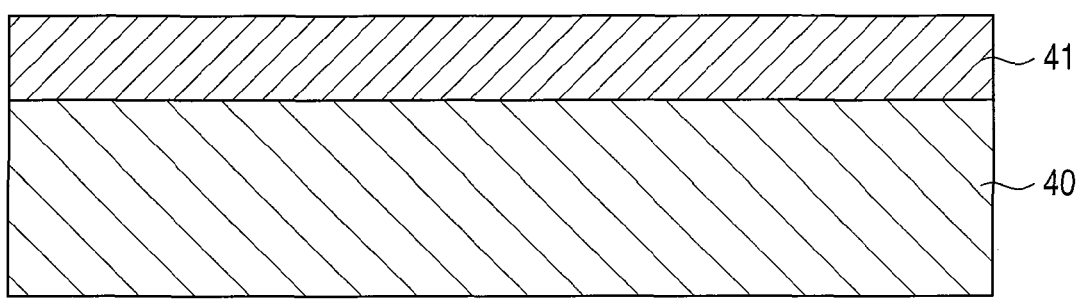
FIG. 4A is view showing a state where an epitaxial layer is formed on the top of a semiconductor substrate of an optical I/O array module according to a second embodiment of the invention.

FIG. 4A is view showing a state in which a epitaxial layer 41 is formed on the top of a semiconductor substrate 40. As a constituent material of the semiconductor substrate 40, there are cited gallium arsenide (GaAs), indium phosphide (InP), and so forth, commonly used in an optical element of a compound semiconductor, and use is preferably made of a material having transparency against an emission light wavelength lest a loss occurs upon light passing through the semiconductor substrate 40.

Figure 4B:
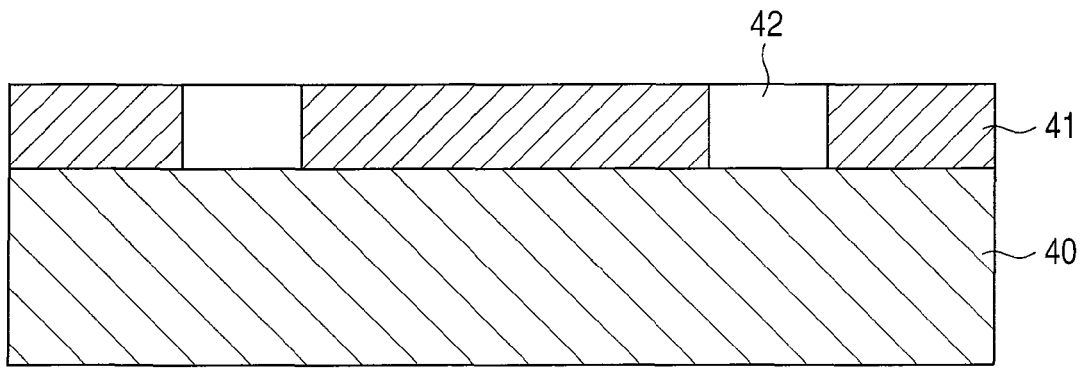
FIG. 4B is view showing a state where a forming process is applied to the epitaxial layer to thereby form light emission parts.

Next, as shown in FIG. 4B, a forming process such as the photolithography, etching, and so forth is applied to the epitaxial layer 41 to thereby form light emission parts 42. A mirror structure, and so forth are provided inside, or in the vicinity of the light emission part 42 so as to enable light from the light emission part 42 to outgo in the direction of the semiconductor substrate 40 although no particular reference is herein made to a fabrication method in detail.

Figure 4C:
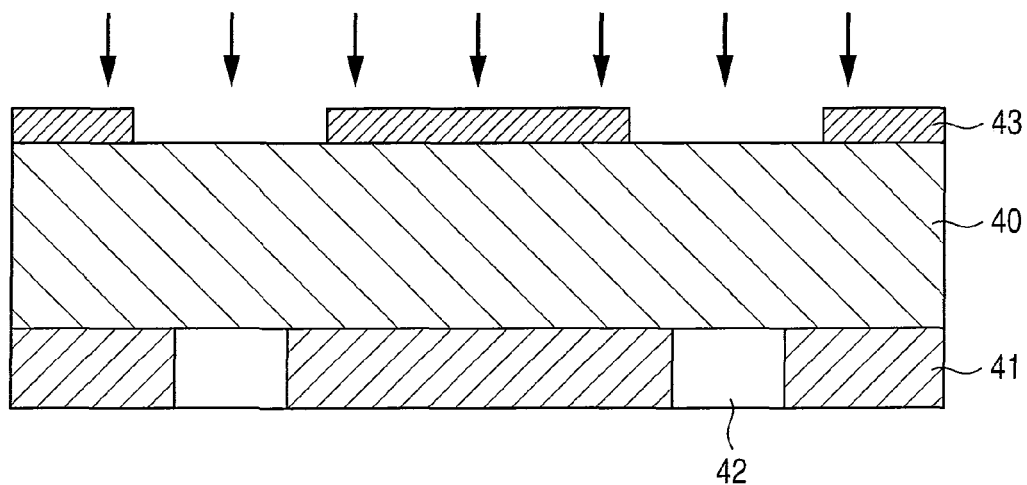
FIG. 4C is view showing a state where a passivation film is formed on a surface of the semiconductor substrate, opposite from the epitaxial layer, by patterning.

Next, as shown in FIG. 4C, a passivation film 43 is formed on a surface of the semiconductor substrate 40, opposite from the epitaxial layer 41, by patterning using the lithography. For a constituent material of the passivation film 43, use may be made of a photosensitive resist, and a silicon oxide film.

Figure 4D:
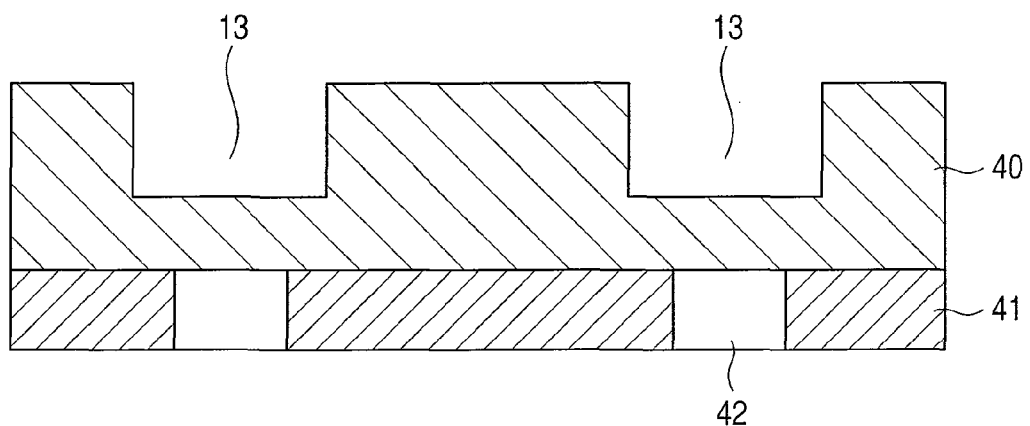
FIG. 4D is view showing a state where concave grooves are formed in the semiconductor substrate, thereby completing laser diode arrays.

Then, as shown in FIG. 4D, concave grooves are formed in the semiconductor substrate 40 by use of a semiconductor-etching process, thereby completing laser diode arrays. The concave grooves can be formed by dry etching using plasma, and gas, wet etching using chemicals, or combination of the dry etching and the wet etching, and so forth although no particular reference is made to the semiconductor-etching process either. Now, the procedure of fabricating the laser diode array has been described as above by way of example, however, a photo diode array as another component of the optical I/O array module according to the second embodiment of the invention can be manufactured by the same procedure as described above.

Third Embodiment

Figure 5:
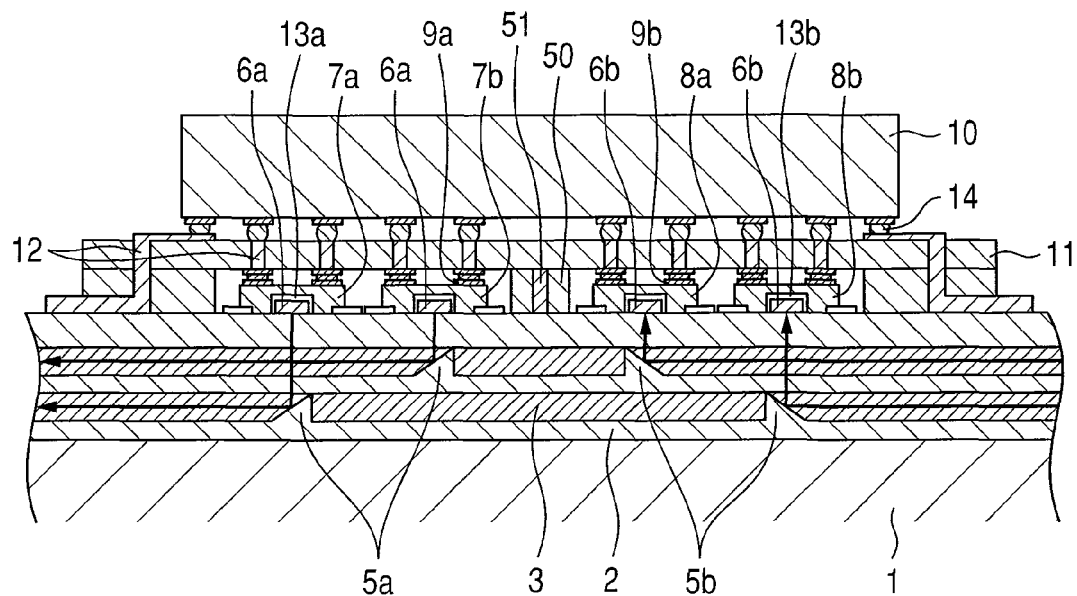
FIG. 5 is a sectional view showing an optical I/O array module according to a third embodiment of the invention.

Next, there is described a third embodiment of the invention with reference to FIG. 5. FIG. 5 is a sectional view showing an optical I/O array module according to the third embodiment of the invention. With the present structure of the optical I/O array module, a protrusion 50 made up a portion of a filmy layer 11 is provided at the midpoint spot between laser diode arrays 7a, 7b, and photo diode arrays 8a, 8b. With the adoption of the present structure, the laser diode arrays 7a, 7b, and the photo diode arrays 8a, 8b come to be hemmed in respective enclosed spaces inside the filmy layer 11 to be thereby sealed from outside of the module, so that it is possible to lessen deterioration in optical elements, taking place over time due to adhesion of moisture, and foreign particles. The enclosed space may be hermetically sealed from outside air, however, even if the enclosed space is filled up with a transparent resin or the like, thereby making up a non-hermetically sealed structure, the same effect as described above can be obtained.

Furthermore, as shown in FIG. 5, an electric via 51 is formed in the protrusion 50 made up of the portion of the filmy layer 11. By so doing, it is possible to lessen optical, or electrical cross talk occurring between transmission and reception sides, posing a problem with an optical module wherein the laser diode arrays 7a, 7b, and the photo diode arrays 8a, 8b are disposed in close proximity of each other because effects of the cross talk can be blocked by the electric via 51. Further, the electric via 51 may be an integrally formed electrode pattern if it is sufficiently large in length than the length or width of an optical element, or the electric via 51 may be in the form of multiple lengths of vias of a given diameter, being combined together, although no particular reference is herein made to the shape of the electric via 51.

Fourth Embodiment

Figure 6:
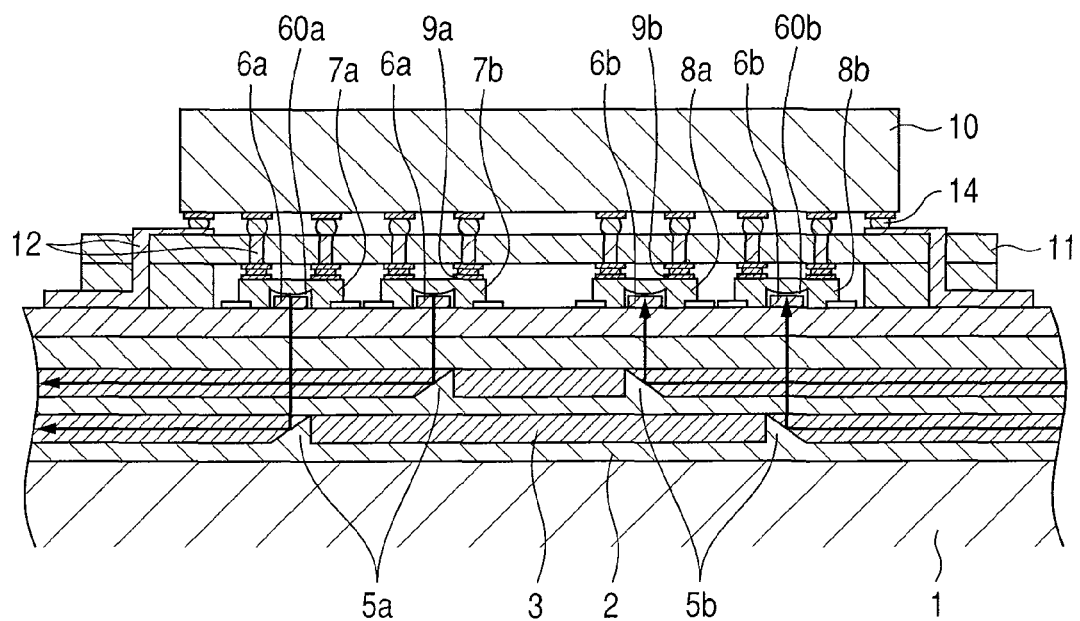
FIG. 6 is a sectional view showing an optical I/O array module according to a fourth embodiment of the invention.

Subsequently, there is described a fourth embodiment of the invention with reference to FIG. 6. FIG. 6 is a sectional view showing an optical I/O array module according to the fourth embodiment of the invention. With the present structure, lenses 60a, 60b are formed so as to be integral with the respective inner peripheries of concave grooves provided in portions of a semiconductor substrate, corresponding to laser diode arrays 7a, 7b, and photo diode arrays 8a, 8b, respectively. With the adoption of the present structure, on the transmission side of the module, a optical signal outgoing from each of the laser diode arrays 7a, 7b, in the direction vertical to the substrate, is condensed by the lens 60a formed in the semiconductor substrate to be subjected to optical-path conversion in the horizontal direction of the substrate through the intermediary of a convex member 6a, and a mirror part 5a of an optical waveguide (core) before being propagated through the optical waveguide (core) 3. On the other hand, on the reception side of the module, light propagated through the optical waveguide (core) 3 is subjected to optical-path conversion in the direction vertical to the substrate by the a mirror part 5b to be condensed by the lens 60b formed in the semiconductor substrate through the intermediary of a convex shaped member 6b before undergoing photoelectric conversion in the photo diode arrays 8a, 8b, thereby being taken out as a light signal.

As a result, either optical linkage between the laser diode arrays 7a, 7b, and the optical waveguide (core) 3, or optical linkage between the optical waveguide (core) 3 and the photo diode arrays 8a, 8b is enabled with a lower loss, and at a higher density through the intermediary of the respective lenses 60a, 60b, formed in the semiconductor substrate, and the respective mirror parts 5a, 5b of the optical waveguide (core). Furthermore, since the respective lenses 60a, 60b are formed integrally with the respective portions of the semiconductor substrate, corresponding to the laser diode arrays 7a, 7b, and the photo diode arrays 8a, 8b, there is no need for mounting an optical component between the optical waveguide (core) and the respective optical elements, so that the optical I/O array module can be made up of fewer components, and by use of fewer steps of fabricating processing.

Fifth Embodiment

Figure 7:
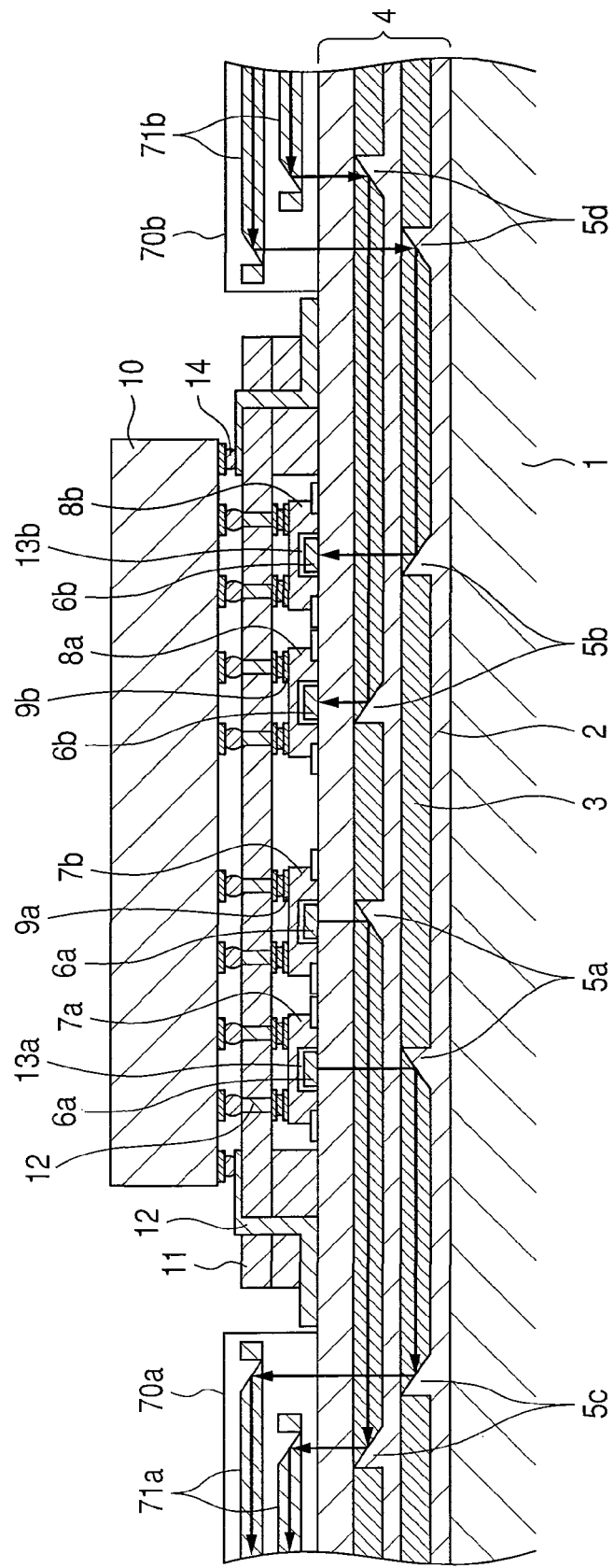
FIG. 7 is a sectional view showing an optical I/O array module according to a fifth embodiment of the invention.

FIG. 7 is a sectional view showing an optical I/O array module according to a fifth embodiment of the invention. In this case, on the transmission side of the module, a mirror part 5c is formed at a spot opposed to a mirror part 5a of an optical waveguide (core), through the intermediary of the optical waveguide (core) 3, the mirror part 5a of the optical waveguide (core) being optically linked to a laser diode arrays 7a, 7b, and a light signal subjected to optical-path conversion at the mirror part 5c, in the direction vertical to the substrate, is optically linked to an optical interconnect 71a having a connector 70a. Similarly on the reception side of the module, a light signal outputted from an optical interconnect 71b having a connector 70b is subjected to optical-path conversion at a mirror part 5d, in the direction parallel to the substrate, and light propagated through the optical waveguide (core) 3 is again subjected to optical-path conversion at a mirror part 5b, in the direction vertical to the substrate, to be optically linked to photo diode arrays 8a, 8b.

With the adoption of the present structure, it is possible to male up an optical I/O array module serving a terminal of inter-board signal transmission, capable of optical linkage at a high density between, for example, daughterboards and a backplane inside a transmission device.

Sixth Embodiment

Figure 8:
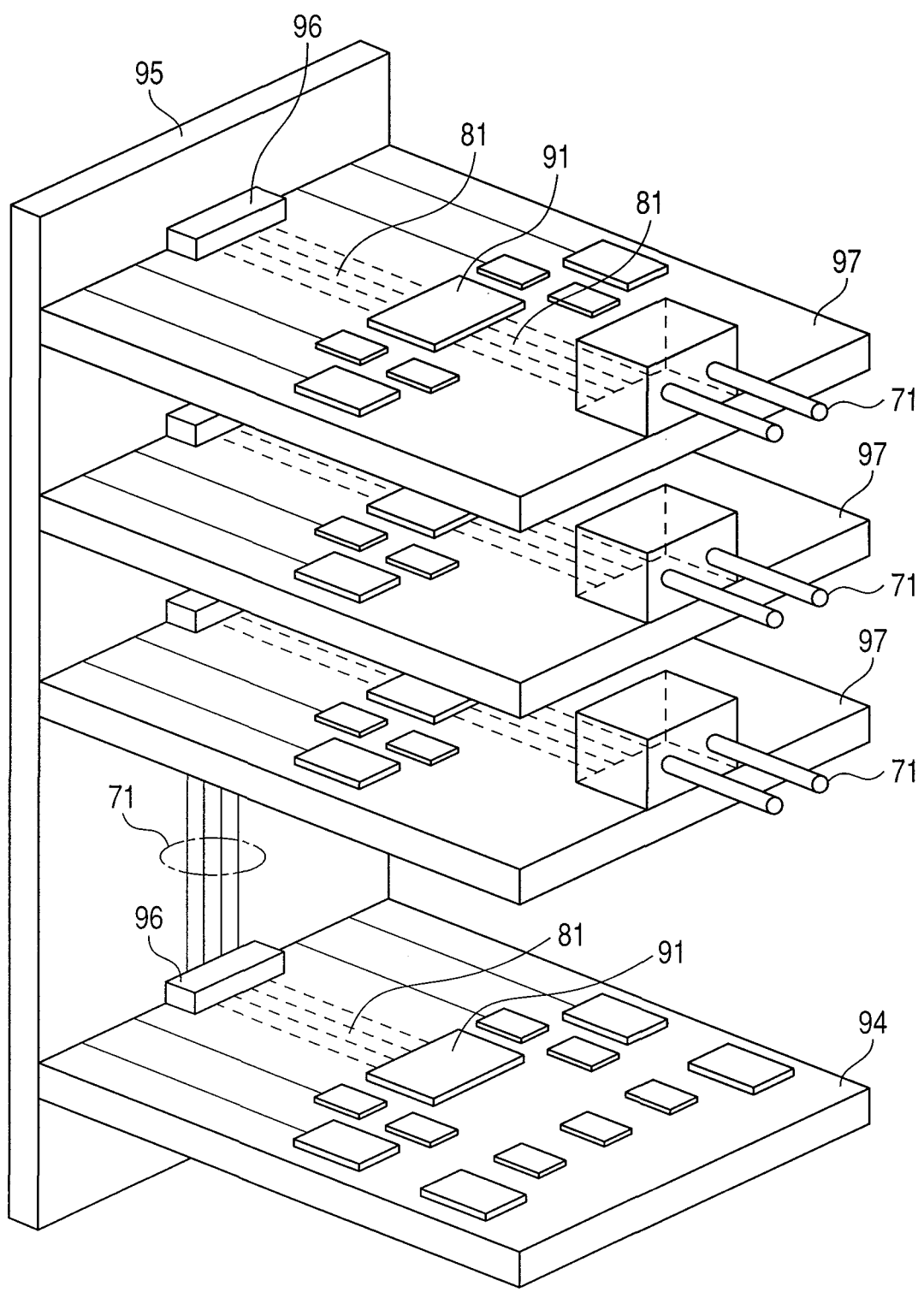
FIG. 8 is a view broadly showing a sixth embodiment of the invention, wherein the optical I/O array module according to the present invention is applied.

FIG. 8 is a view broadly showing a sixth embodiment of the invention, wherein the optical I/O array module according to the present invention is applied. Herein, there is shown an example in which the optical I/O array module according to the present invention is applied to respective daughterboards 97 connected to a backplane 95. As shown in FIG. 8, a signal transmitted from outside of a substrate, such as Ethernet, and so forth, is transmitted from a front part of the board to an optical waveguide (core) 3 through the intermediary of an optical interconnect 71 such as an optical fiber to be subsequently converted into an electric signal by the action of laser diode arrays inside an optical I/O array module 91, the electric signal processed by an integrated circuit is further converted into a light signal by the laser diode arrays inside the optical I/O array module to be optically linked to an optical connector 96 on a side of the daughterboard, adjacent to the backplane, through the intermediary of the optical waveguide (core) 3. Further, the light signal from each of daughterboards 97 is collected to a switch card 94 through the intermediary of optical interconnects 71 such as optical fibers of the backplane. Further, the light signal from each of daughterboards 97 is optically linked with optical elements in an optical I/O array module 91 through the intermediary of optical signal transmission lines 81 provided on the switch card 94, so that there is provided a function for inputting or outputting a signal processed by an integrated circuit to, or from the respective daughterboards 97 again.

The present invention will render it possible to realize reduction in the number of components, and the number of the steps of a fabricating processing, resulting in lower cost, and to provide an optical I/O array module large in capacity, operable at low power consumption, and a transmission device using the same.

What is claimed is:

1. An optical I/O array module comprising:
    an optical waveguide provided on a substrate, the optical waveguide being for use in propagating a optical signal;
    mirror parts provided in the optical waveguide, the mirror parts each having a tapered face for varying a propagation direction of the light signal;
    a convex shaped member or a concave shaped member, provided above the optical waveguide, the convex shaped member or the concave shaped member being positioned at spots above the respective mirror parts;
    laser diode arrays and photo diode arrays, provided above the optical waveguide, the laser diode arrays and the photo diode arrays having one principal surface provided with either a concave shape, or a convex shape;
    a thin-film interconnect layer provided above the laser diode arrays, and the photo diode arrays, the thin-film interconnect layer being provided with electric vias; and
    at least one LSI of LSIs provided above the thin-film interconnect layer, the LSIs integrating circuits including a driver IC LSI, or an amplifier LSI, for either driving, or amplifying respective optical elements of the laser diode arrays and the photo diode arrays, or at least one LSI of the driver IC LSI and the amplifier LSI,
    wherein the laser diode array and the photo diode array each are provided with a concave shape against the convex shaped member while the laser diode array and the photo diode array each are provided with a convex shape against the concave shaped member, and the laser diode array, and the photo diode array are mated with the convex shaped member, or into the concave shaped member to effect positioning, thereby causing the laser diode array, and the photo diode array to be optically linked with the optical waveguide, and
    wherein a support in a convex shape, formed in the thin-film interconnect layer, is provided between a region where the laser diode arrays are disposed, and a region where the photo diode arrays are disposed, and enclosed spaces are provided within the thin-film interconnect layer, thereby electrically and optically blocking the respective laser diode arrays from the respective photo diode arrays.

2. The optical I/O array module according to claim 1, wherein the thin-film interconnect layer is made of a material having visible transparency.

3. The optical I/O array module according to claim 1, wherein the mirror parts include at least a mirror part having a tapered face provided such that the optical signal from the optical waveguide is propagated toward the photo diode array, and a mirror part having a tapered face provided such that the optical signal emitted from the laser diode array is guided into the optical waveguide.

4. The optical I/O array module according to claim 1, wherein the constituent material of the convex shaped member, or the concave shaped member belongs to a group of materials identical in property to the constituent material of the optical waveguide.

5. The optical I/O array module according to claim 1, wherein the convex shaped member, or the concave shaped member is disposed at a position for allowing the light signal to pass therethrough after the propagation direction is varied at the mirror part, or at a position for allowing the light signal to proceed to the mirror part after the light signal passes through the convex shaped member, or the concave shaped member.

6. The optical I/O array module according to claim 1, wherein electrode pads provided in the laser diode array, and the photo diode array, respectively, are electrically connected with the driver IC LSI, the amplifier LSI, or the one LSI through the intermediary of each of the electric vias.

7. The optical I/O array module according to claim 1, wherein the support in the convex shape, made up of a portion of the filmy layer, is provided with an electric via.

8. The optical I/O array module according to claim 1, wherein portions of a semiconductor substrate, corresponding to the laser diode arrays, and the photo diode arrays, respectively, are provided with a convex shape having a lens function for the concave shaped member.

9. The optical I/O array module according to claim 1, wherein the convex shaped members each are provided with a lens on the respective inner peripheries of concave grooves provided in portions of a semiconductor substrate, corresponding to the laser diode array, and the photo diode array, respectively.

10. The optical I/O array module according to claim 1, wherein the photo diode arrays each are made up of surface-receiving photodiodes for receiving light in the direction vertical to a portion of the semiconductor substrate, corresponding to the photo diode arrays.

* * * * *